United States Patent [19]

Durinck et al.

[11] Patent Number: 5,054,701
[45] Date of Patent: Oct. 8, 1991

[54] MILLING PROCESS AND APPARATUS

[75] Inventors: René Durinck, Villeneuve D'Ascq; Philippe Lagache, Marcq-en Baroeul; Alain Cordonnier, Lille, all of France

[73] Assignee: Fives-Cail Babcock, Montreuil Cedex, France

[21] Appl. No.: 540,220

[22] Filed: Jun. 18, 1990

[30] Foreign Application Priority Data

Jun. 20, 1989 [FR] France .............................. 89/08165

[51] Int. Cl.⁵ .......................... B02C 4/02; B02C 4/40
[52] U.S. Cl. .................................... 241/167; 241/226
[58] Field of Search ............... 241/166, 167, 159, 226, 241/30, 231, 232, 233, 234

[56] References Cited

U.S. PATENT DOCUMENTS 1,848,916  3/1932  Vasel .................................... 241/226

FOREIGN PATENT DOCUMENTS 0115440  8/1984  European Pat. Off. ............ 241/167
2620635  9/1987  France .
8808330  11/1988  PCT Int'l Appl. ................. 241/226
12371    8/1908  United Kingdom ................ 241/226
8841     7/1910  United Kingdom ................ 241/167

Primary Examiner—Mark Rosenbaum
Attorney, Agent, or Firm—Collard, Roe & Galgano

[57] ABSTRACT

An apparatus for milling particulate mineral material comprises two cylinders rotatable in opposite directions about parallel axes defining a plane while being yieldingly pressed towards each other, the cylinders defining therebetween a milling compression space having an inlet for the particulate material above the plane and an outlet for the milled material below the plane. To reduce the formation of agglomerates and prevent circumferential and/or lateral flushing of the material, the outlet space is closed by respective lateral flanges at the opposite cylinder end faces and a barrier including a scraping bar extending across the outlet space below the plane into contact with the flanges and having one edge in contact with the peripheral surface of one of the cylinders while an opposite edge defines a milled material output of reduced cross sectional area with the peripheral surface of the other cylinder.

4 Claims, 2 Drawing Sheets

MILLING PROCESS AND APPARATUS

BACKGROUND OF THE INVENTION

1. Field of the Invention

The present invention relates to a process and apparatus for finely crushing or milling particulate mineral material, such as ores.

2. Description of the Prior Art

French patent application publication No. 2,620,635, published Mar. 24, 1989, discloses a process and apparatus for milling particulate mineral material, wherein a layer of the material is subjected to compression in a space between two cylinders rotated in opposite directions about parallel axes defining a plane and yieldingly pressed against each other. The rotation of the cylinders force-feeds the material into the nip between the cylinders where it is milled, and the outlet space below the plane is partially closed off to keep the milled material under pressure, only an outlet passage of reduced cross sectional area being left open for discharge of the milled material. The back pressure exerted on the material being milled in the nip between the cylinders causes the particles to be de-cohered as a result of the generated shearing forces caused by the anisotropy of the layer of the material being milled in the nip, and counteracts the formation of agglomerates.

SUMMARY OF THE INVENTION

It is the primary object of this invention to improve this prior art process and apparatus by assuring a better closure of the outlet space below the nip so that the back pressure is applied against the entire nip between the cylinders to reduce the formation of agglomerates even further and to prevent circumferential and/or lateral flushing of the milled material, particularly in cases where the crushed material is recycled and, therefore, contains a high percentage of fines whose dimensions are considerably smaller than the width of the nip.

The above and other objects and advantages are accomplished according to one aspect of the invention with a process of milling particulate mineral material, which comprises the steps of subjecting a layer of the mineral material to a milling compression in a space between two cylinders having opposite ends and being rotated in opposite directions about parallel axes defining a plane while being yieldingly pressed towards each other, and closing the space laterally below the plane by flanges at the opposite cylinder ends and at least partially by a barrier including a scraping bar in contact with the peripheral surface of one of the cylinders and extending across the space whereby the milled mineral material is under pressure in the space defined by the flanges, the peripheral surfaces of the cylinders and the scraping bar barrier.

According to another aspect of the present invention, an apparatus for milling particulate mineral material and comprising two cylinders having opposite end faces and rotatable in opposite directions about parallel axes defining a plane while being yieldingly pressed towards each other, the cylinders defining therebetween a milling compression space having an inlet for the particulate material above the plane and an outlet for the milled material below the plane, is provided with respective flanges at the opposite cylinder end faces laterally closing the outlet space below the plane, and a barrier including a scraping bar extending across the outlet space below the plane into contact with the flanges and having one edge in contact with the peripheral surface of one of the cylinders while an opposite edge defines a milled material output of reduced cross sectional area with the peripheral surface of the other cylinder.

BRIEF DESCRIPTION OF THE DRAWING

The above and other objects, advantages and features of this invention will become more apparent from the following detailed description of certain now preferred embodiments thereof, taken in conjunction with the accompanying generally schematic drawing wherein.

DESCRIPTION OF THE PREFERRED EMBODIMENTS

Figure 1:
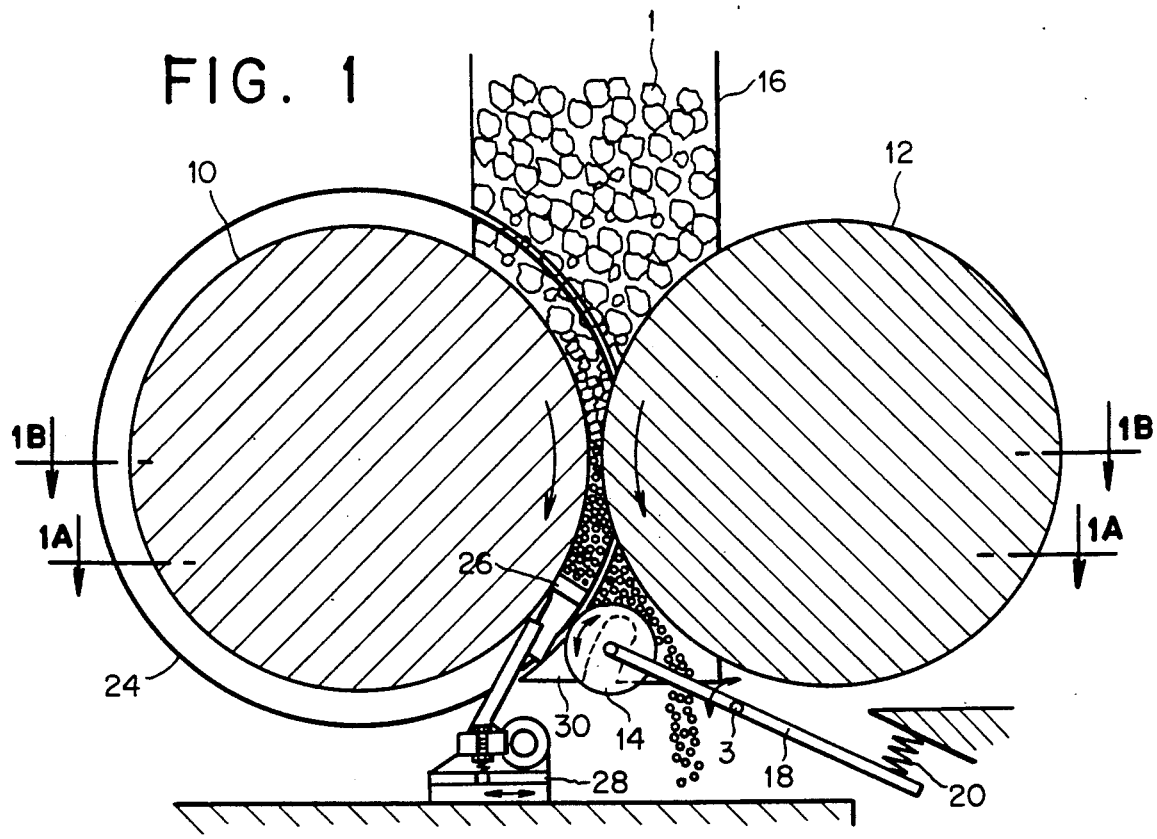
FIG. 1 is a transverse cross section of a milling apparatus incorporating the invention.
Figure 1A:
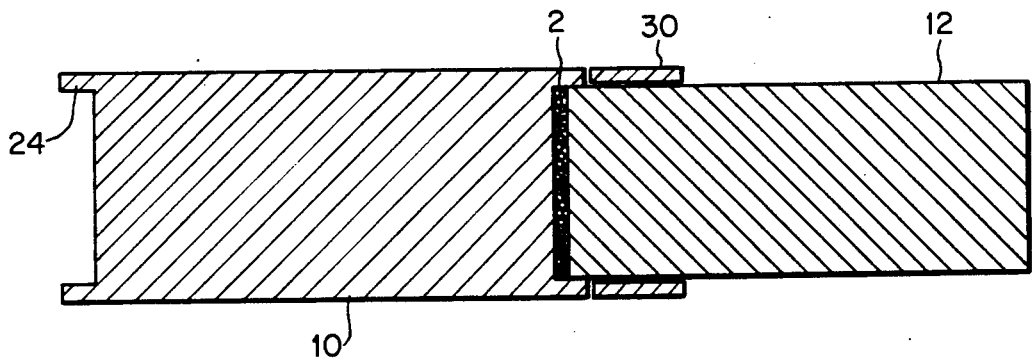
FIGS. 1A and 1B, respectively, are cross sections along lines X—X and A—A of FIG. 1.
Figure 1B:
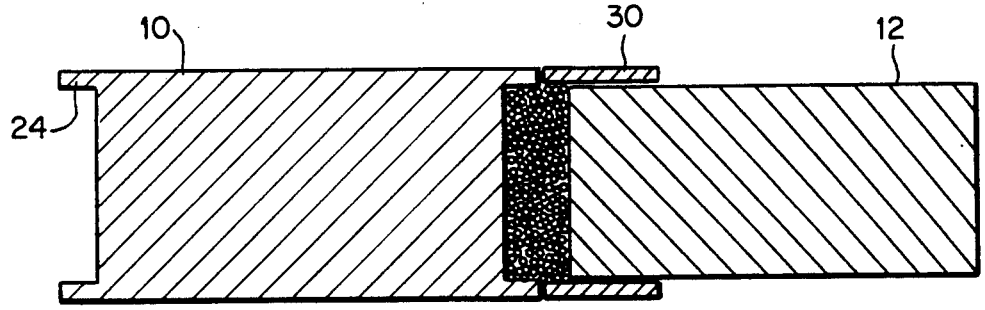
Figure 2:
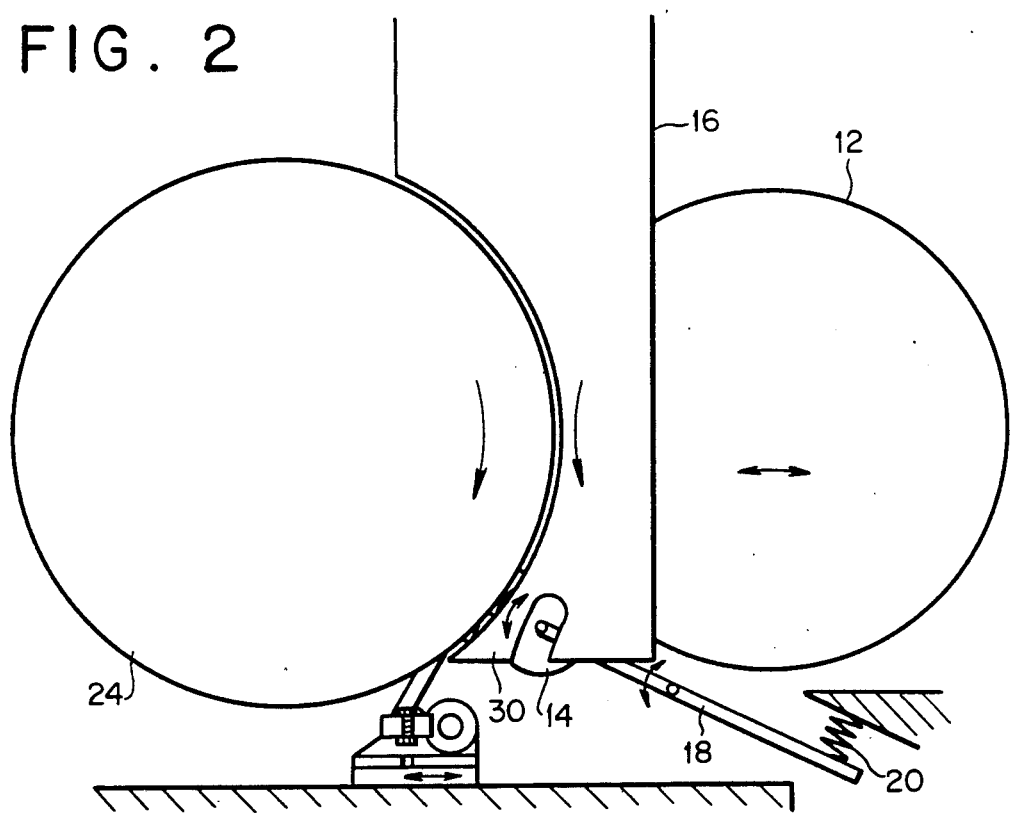
FIG. 2 is a side elevational view of the milling apparatus.

Referring now to the drawing and first to FIGS. 1 and 2, there is shown an apparatus for milling particulate mineral material 1, which comprises two cylinders 10, 12 having opposite end faces and rotatable in opposite directions (indicated by two vertical arcuate arrows) about parallel axes defining plane X—X while being yieldingly pressed towards each other. In the illustrated embodiment, the bearings for cylinder 10 are stationary while the bearings for cylinder 12 are mounted on slideways or pivotal arms to permit this cylinder to be pressed towards, or displaced from, cylinder 10, in the manner indicated by the horizontal arcuate arrow at cylinder 12. Cylinder 12 is yieldingly pressed against cylinder 10 by a suitable spring or hydro-pneumatic system (not shown). Equally conventional means (not shown) is provided for rotating the cylinders at the same speed and in opposite directions. At rest, the spacing between cylinders 10, 12, i.e. the width of the nip therebetween, is maintained at a minimum value set by suitable abutments (not shown) in the displacement path of cylinder 12. In operation, particulate mineral material 1 is charged into feeding chute 16 above the cylinders and the charging rate is sufficient to cause the flowing material to form a material layer 2 having a width considerably exceeding the set minimal spacing between the cylinders so that the cylinders are yieldingly pressed together against the particulate material flowing therebetween, which causes milling of the material to be effected not only by crushing but also by attrition between the frictionally engaging particles so that the material is milled to contain a large proportion of fine particles.

The material is fed to, and held in, the milling apparatus by feeding chute 16. The cylinders define therebetween a milling compression space having an inlet for the particulate material above plane X—X and an outlet for the milled material below the plane, and respective flanges 24, 30 at the opposite cylinder end faces laterally close the outlet space below plane X—X. A barrier including scraping bar 26 extends across the outlet space below the plane into contact with the flanges. The barrier has one edge in contact with the peripheral surface of cylinder 10 while an opposite edge defines a milled material output of reduced cross sectional area with the peripheral surface of the other cylinder 12.

In the illustrated embodiment, the flanges comprise, at each one of the cylinder end faces, an annular flange 24 integral cylinder 10. Annular flanges 24 frame cylinder 10 and have a circular edge, and a fixed flange 30 arranged in the plane of the annular flange and having an arcuate edge conforming to the circular edge of the annular flange, the circular and arcuate flange edges defining a small space of tolerance therebetween. Fixed flanges 30, 30 extend from plane X—X defined by the cylinder axes downwardly to the level of the scraping bar barrier Annular flanges 24, 24 are slightly spaced from the end faces of the other cylinder 12.

Annular flanges 24 may be machined into cylinder 10 or they may be maintained mechanically on the lateral end faces of the cylinder. They laterally close the space between the two cylinders at the end faces thereof, above and below plane X—X defined by the cylinder axes and at least in the zone of the greatest compression applied by the cylinders to the flowing layer of particulate material 1. This lateral closure is completed at the bottom of the outlet space by fixed flanges 30, 30 which are extensions of the lateral walls of feeding chute 16.

Scraping bar 26 extends along a generatrix of the peripheral surface of cylinder 10 and being also in contact with, or at a very slight distance from, the interior faces of flanges 24 cleans the cylinder and flange surfaces during the rotation of cylinder 10. The scraping bar is so mounted on fixed support 28 that its distance from cylinder 10 may be adjusted, as indicated by a double-headed horizontal arrow, particularly to compensate for wear.

If desired, it would also be possible to close the outlet space laterally at one end by a flange integral with one of the cylinders and at an opposite end by an annular flange integral with the other cylinder. Furthermore, if desired, cylinder flanges 24 may be omitted entirely and the outlet space below plane X—X may be laterally closed solely by fixed flanges at the opposite end faces of the cylinders and slightly spaced therefrom.

In the embodiment of FIG. 1, the barrier (shown in side elevational view) further includes roller 14 having an axis extending parallel to the cylinder axes. Scraping bar 26 and roller 14 are arranged side-by-side, and the roller defines the milled material output of reduced cross sectional area with the peripheral surface of the other cylinder 12. The bearings of roller 14 are supported on two arms 18 pivotal about an axis extending parallel to the cylinder axes and spring 20 acts on the arms so that the roller is yieldingly pressed towards the other cylinder 12 so that the roller may assume a position of equilibrium with respect to yieldingly mounted cylinder 12 under all operating conditions.

The section of scraping bar 26 is so selected that, in all operating positions of roller 14, the distance between the roller and the adjacent edge of the scraping bar remains very small and substantially constant. Pivoting axis 3 of support arms 18 is adjustably displaceable to compensate for wear of scraping bar 26 and/or roller 14. The material outlet space below plane X—X defined by the peripheral cylinder surfaces, flanges 24, 30, scraping bar 26 and roller 14 is open towards the outside only by the narrow output defined between roller 14 and cylinder 12. By controlling the bias of spring 20, it is possible to adjust the back pressure building up in this closed outlet space so that the milled material therein will be practically free of agglomerates. This back pressure will be exerted upon the particulate material layer at the level of the nip between the two cylinders, i.e. in plane X—X, and causes it to de-cohere a it flows through the nip.

The apparatus of this invention also operates to prevent flushing of the particulate material when it contains particles whose dimensions are considerably smaller than the width of the nip between the cylinders in plane X—X; in other words, it prevents such fines from being displaced in the layer of material at a speed exceeding the peripheral speed of the rotating cylinders or from escaping laterally without being subjected to the milling force. Such operating conditions occur primarily when the milled product is recycled for renewed milling, possibly after having been passed through a classification apparatus wherein the finest particles are separated.

Figure 3:
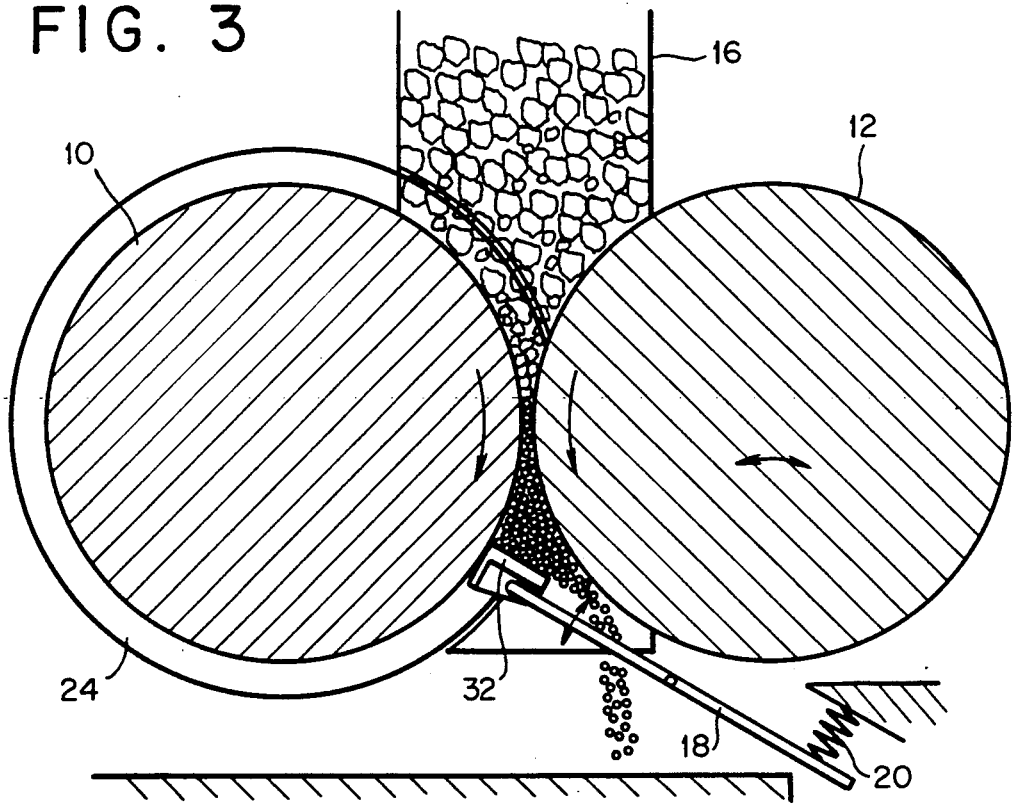
FIG. 3 is a cross sectional view similar to FIG. 1 and showing another embodiment of the milling apparatus.

In FIG. 3, like reference numerals designate like parts, and this embodiment differs from that of FIG. 1 in that the barrier includes no roller and a scraping bar 32 of suitable dimensions is mounted on pivotal arms 18 for yieldingly contacting the peripheral surface of cylinder 10 and being biased towards cylinder 12 by spring 20.

What is claimed is:

1. An apparatus for milling particulate mineral material, comprising
   (a) two cylinders having opposite end faces and rotatable in opposite directions about parallel axes defining a plane while being yieldingly pressed towards each other, the cylinders defining therebetween a milling compression space having an inlet for the particulate material above the plane and an outlet for the milled material below the plane,
   (b) respective flanges at the opposite cylinder end faces laterally closing the outlet space below the plane, the flanges comprising, at each one of the cylinder end faces,
      (1) an annular flange integral with one of the cylinders and having a circular edge, and
      (2) a fixed flange arranged in the plane of the annular flange and having an arcuate edge conforming to the circular edge of the annular flange, and
   (c) a barrier including a scraping bar extending across the outlet space below the plane into contract with the flanges and having one edge in contact with the peripheral surface of one of the cylinders and defining a milled material output of reduced cross sectional area with the peripheral surface of the other cylinder,
      (1) the fixed flanges extending downwardly from the plane defined by the cylinder axes to the level of the barrier whereby the milled mineral material is kept under pressure in the space defined by the peripheral cylinder surfaces, the flanges and the barrier.

2. The milling apparatus of claim 1, wherein the barrier further includes a roller having an axis extending parallel to the cylinder axes, the scraping bar and the roller being arranged side-by-side, and the roller defines the milled material output of reduced cross sectional area with the peripheral surface of the other cylinder.

3. The milling apparatus of claim 2, further comprising means for yieldingly pressing the roller towards the other cylinder.

4. The milling apparatus of claim 2, further comprising means for yieldingly pressing the scraping bar towards the peripheral surface of the other cylinder.

* * * * *